(12) United States Patent
Kang et al.

(10) Patent No.: US 10,123,341 B2
(45) Date of Patent: *Nov. 6, 2018

(54) METHOD AND APPARATUS FOR TRANSMITTING DATA IN VERY HIGH THROUGHPUT WIRELESS LOCAL AREA NETWORK SYSTEM

(71) Applicant: LG ELECTRONICS INC., Seoul (KR)

(72) Inventors: Byeong Woo Kang, Anyang-si (KR); Yu Jin Noh, Anyang-si (KR); Dae Won Lee, Anyang-si (KR); Yong Ho Seok, Anyang-si (KR)

(73) Assignee: LG ELECTRONICS INC., Seoul (KR)

( * ) Notice: Subject to any disclaimer, the term of this patent is extended or adjusted under 35 U.S.C. 154(b) by 21 days.

This patent is subject to a terminal disclaimer.

(21) Appl. No.: 15/180,884

(22) Filed: Jun. 13, 2016

(65) Prior Publication Data

US 2016/0302213 A1 Oct. 13, 2016

Related U.S. Application Data

(63) Continuation of application No. 13/505,382, filed as application No. PCT/KR2011/003151 on Apr. 28, 2011, now Pat. No. 9,397,707.

(Continued)

(51) Int. Cl.
*H04W 72/08* (2009.01)
*H03M 13/00* (2006.01)
(Continued)

(52) U.S. Cl.
CPC ..... *H04W 72/085* (2013.01); *H03M 13/6527* (2013.01); *H04L 1/0071* (2013.01);
(Continued)

(58) Field of Classification Search
CPC .............. H03M 13/6527; H04L 1/0071
(Continued)

(56) References Cited

U.S. PATENT DOCUMENTS 7,054,296 B1 5/2006 Sorrells et al.
8,665,906 B1 * 3/2014 Liu .................. H04B 7/0617
370/349

(Continued)

FOREIGN PATENT DOCUMENTS

CN 1792054 A 6/2006
CN 1879341 A 12/2006
(Continued)

OTHER PUBLICATIONS

"IEEE 802.11", Wikipedia, the free encyclopedia, Mar. 3, 2010, 9 pages, XP055184405.

(Continued)

*Primary Examiner* — Kevin M Burd
(74) *Attorney, Agent, or Firm* — Birch, Stewart, Kolasch & Birch, LLP

(57) ABSTRACT

A method is provided for transmitting data in a wireless local area network. A transmitter generates an encoded data unit by performing a channel coding to transmission data to be included in a data field of a physical layer protocol data unit (PPDU). The transmitter generates at least one spatial block by re-arranging the encoded data unit, and divides each spatial block of at least one spatial block into two frequency segments. A bandwidth of each frequency segment is half of a bandwidth of the each spatial block. The transmitter interleaves the two frequency segments to generate a first interleaved segment and a second interleaved segment, respectively, and generates first and second mapped sequences by respectively mapping the first and second interleaved segments into a signal constellation. The trans- (Continued)

mitter performs an Inverse Discrete Fourier Transform (IDFT) on the first and second mapped sequences to generate and transmit a transmission signal.

12 Claims, 14 Drawing Sheets

Related U.S. Application Data

(60) Provisional application No. 61/329,104, filed on Apr. 29, 2010.

(51) Int. Cl.

| | | |
|---|---|---|
| *H04L 1/00* | (2006.01) | |
| *H04L 1/06* | (2006.01) | |
| *H04L 27/26* | (2006.01) | |
| *H03M 13/23* | (2006.01) | |
| *H03M 13/27* | (2006.01) | |
| *H03M 13/35* | (2006.01) | |
| *H04L 5/00* | (2006.01) | |
| *H04L 25/02* | (2006.01) | |
| *H04W 84/12* | (2009.01) | |

(52) U.S. Cl.
CPC .......... *H04L 1/0072* (2013.01); *H04L 1/0643* (2013.01); *H04L 5/0026* (2013.01); *H04L 5/0048* (2013.01); *H04L 27/2628* (2013.01); *H03M 13/23* (2013.01); *H03M 13/2707* (2013.01); *H03M 13/356* (2013.01); *H04L 5/0023* (2013.01); *H04L 25/0204* (2013.01); *H04W 84/12* (2013.01)

(58) Field of Classification Search
USPC ....................................................... 375/260
See application file for complete search history.

(56) References Cited

U.S. PATENT DOCUMENTS

| | | | |
|---|---|---|---|
| 9,397,707 B2* | 7/2016 | Kang ................ | H03M 13/6527 |
| 2005/0186958 A1 | 8/2005 | Hansen et al. | |
| 2007/0140364 A1 | 6/2007 | Ouyang et al. | |
| 2007/0196072 A1 | 8/2007 | Zhou et al. | |
| 2008/0101493 A1 | 5/2008 | Niu et al. | |
| 2008/0117886 A1 | 5/2008 | Kim et al. | |
| 2009/0052578 A1 | 2/2009 | Sawai | |
| 2010/0080250 A1 | 4/2010 | Kassel et al. | |
| 2011/0026623 A1* | 2/2011 | Srinivasa ............. | H04L 1/0016 375/260 |
| 2011/0026639 A1 | 2/2011 | Rouquette-Leveil et al. | |
| 2013/0084815 A1 | 4/2013 | Stirling-Gallacher et al. | |

FOREIGN PATENT DOCUMENTS

| | | |
|---|---|---|
| EP | 0 759 665 A1 | 2/1997 |
| EP | 1 821 473 A2 | 8/2007 |
| EP | 1 829 264 A1 | 9/2007 |
| EP | 2 034 651 A2 | 3/2009 |
| JP | 2008-259187 A | 10/2008 |
| JP | 2009-520436 A | 5/2009 |
| WO | WO 2004/102863 A1 | 11/2004 |
| WO | WO 2007/073076 A1 | 6/2007 |
| WO | WO 2008/110998 A2 | 9/2008 |
| WO | WO 2009/059252 A2 | 5/2009 |

OTHER PUBLICATIONS

Asghar, et al., "Low Complexity Hardware Interleaver for MIMO-OFDM based Wireless LAN", Circuit and Systems, pp. 1747-1750, May 24, 2009, XP031479555.

Cheong et al., "Segment Parser for 160MHz", IEEE 802.11-10/1279r0, Nov. 8, 2010, 40 pages provided.

IEEE Computer Society, "Part 11: Wireless LAN Medium Access Control (MAC) and Physical Layer (PHY) Specifications", Amendment 5: Enhancements for Higher Throughout, IEEE Std 802.11n-2009, Oct. 29, 2009, 536 pages provided.

Kim et al., "160 MHz PHY Transmission," IEEE 802.11-10/0378r0, Mar. 17, 2010, 12 pages.

Kim et al., "160 MHz Transmission Flow", IEEE 802.11-10/1063rl, Sep. 13, 2010, 26 pages provided.

Oteri, et al., "Space-Time-Frequency Coding for OFDM-Based WLANs", IEEE Communications Society, vol. 5, pp. 2925-2930, Nov. 29, 2004, XP010758260.

Panasonic, "MAC to physical layer mapping and control signaling for carrier aggregation", 3GPP TSG-RAN WG1 Meeting #55, R1-084222, Nov. 10-14, 2008, pp. 1-4.

Stacey, "Multi-Band, Multi-Radio Wireless LANs and PANs", Signals, Systems and Computers, pp. 317-320, Nov. 1, 2009, XP031679607.

Vassis, et al., "The IEEE 802.119 Standard for High Data Rate WLANs", IEEE Network, vol. 19, No. 3, pp. 21-26, May 1, 2005, XP011134801.

Kim et al., "Bits Consideration for SIGNAL fields", IEEE 802.11-10/0382r1, Mar. 15, 2010, slides 1-8.

Anonymous, "Discrete Fourier transform," Wikipedia, Apr. 28, 2010, Retrived on Aug. 31, 2018, XP055503653, 11 pages.

* cited by examiner

METHOD AND APPARATUS FOR TRANSMITTING DATA IN VERY HIGH THROUGHPUT WIRELESS LOCAL AREA NETWORK SYSTEM

CROSS-REFERENCE TO RELATED APPLICATIONS

This Application is a Continuation of U.S. patent application Ser. No. 13/505,382 filed on May 1, 2012 (now U.S. Pat. No. 9,397,707 issued on Jul. 19, 2016), which is filed as the National Phase of PCT/KR2011/003151 filed on Apr. 28, 2011, which claims the benefit under 35 U.S.C. § 119(e) to U.S. Provisional Application No. 61/329,104 filed on Apr. 29, 2010, all of which are hereby expressly incorporated by reference into the present application.

BACKGROUND OF THE INVENTION

The present invention relates to wireless communications, and more particularly, to a method of transmitting data in a wireless local area network (WLAN) system and an apparatus supporting the method.

With the advancement of information communication technologies, various wireless communication technologies have recently been developed. Among the wireless communication technologies, a wireless local area network (WLAN) is a technology whereby Internet access is possible in a wireless fashion in homes or businesses or in a region providing a specific service by using a portable terminal such as a personal digital assistant (PDA), a laptop computer, a portable multimedia player (PMP), etc.

Ever since the institute of electrical and electronics engineers (IEEE) 802, i.e., a standardization organization for WLAN technologies, was established in February 1980, many standardization works have been conducted.

In the initial WLAN technology, a frequency of 2.4 GHz was used according to the IEEE 802.11 to support a data rate of 1 to 2 Mbps by using frequency hopping, spread spectrum, infrared communication, etc. Recently, the WLAN technology can support a data rate of up to 54 Mbps by using orthogonal frequency division multiplex (OFDM). In addition, the IEEE 802.11 is developing or commercializing standards of various technologies such as quality of service (QoS) improvement, access point protocol compatibility, security enhancement, radio resource measurement, wireless access in vehicular environments, fast roaming, mesh networks, inter-working with external networks, wireless network management, etc.

The IEEE 802.11n is a technical standard relatively recently introduced to overcome a limited data rate which has been considered as a drawback in the WLAN. The IEEE 802.11n is devised to increase network speed and reliability and to extend an operational distance of a wireless network. More specifically, the IEEE 802.11n supports a high throughput (HT), i.e., a data processing rate of up to above 540 Mbps, and is based on a multiple input and multiple output (MIMO) technique which uses multiple antennas in both a transmitter and a receiver to minimize a transmission error and to optimize a data rate. In addition, this standard may use a coding scheme which transmits several duplicate copies to increase data reliability and also may use the OFDM to support a higher data rate.

An IEEE 802.11n HT WLAN system employs an HT green field physical layer convergence procedure (PLCP) protocol data unit (PPDU) format which is a PPDU format designed effectively for an HT station (STA) and which can be used in a system consisting of only HT STAs supporting IEEE 802.11n in addition to a PPDU format supporting a legacy STA. In addition, an HT-mixed PPDU format which is a PPDU format defined such that a system in which the legacy STA and the HT STA coexist can support an HT system.

With the widespread use of a wireless local area network (WLAN) and the diversification of applications using the WLAN, there is a recent demand for a new WLAN system to support a higher throughput than a data processing rate supported by the IEEE 802.11n. A next generation WLAN system supporting a very high throughput (VHT) is a next version of the IEEE 802.11n WLAN system, and is one of IEEE 802.11 WLAN systems which have recently been proposed to support a data processing rate of 1 Gbps or higher in a medium access control (MAC) service access point (SAP).

In IEEE 802.11 TGac that conducts standardization of a next generation WLAN system, there is an ongoing research on a method of using 8×8 MIMO and a channel bandwidth of 80 MHz, 160 MHz, or higher to provide a throughput of 1 Gbps or higher and a PLCP format for effectively supporting each STA in a WLAN system in which a legacy STA coexists with an HT STA and a VHT STA. There is a need to consider a method capable of transmitting a PLCP protocol data unit (PPDU) including data by supporting the use of a wider channel bandwidth of the VHT STA in the legacy WLAN system, and a wireless apparatus supporting the method.

SUMMARY OF THE INVENTION

The present invention provides a method in which a wireless local area network (WLAN) system can transmit data by using a wider bandwidth than a frequency bandwidth supported in a legacy WLAN system, and an apparatus supporting the method.

In an aspect, a method of transmitting data in a wireless local area network is provided. The method includes the steps of: generating a data unit including a MAC (Medium Access Control) header and MSDU (MAC Service Data Unit), generating an encoded data unit by encoding the data unit, generating one or more spatial blocks by dividing the encoded data unit, dividing each of the one or more spatial block into a first block and a second block, generating a first interleaved block and a second interleaved block by interleaving the first block and the second block respectively, generating a first mapped sequence by mapping the first interleaved block into signal constellation, generating a second mapped sequence by mapping the second interleaved block into signal constellation, generating the transmission signal by performing IDFT (Inverse Discrete Fourier Transform) to the first mapped sequence and the second mapped sequence; and transmitting the transmission signal.

The step of generating the transmission signal by performing IDFT may include, if the transmission signal is transmitted in a single frequency band, generating the transmission signal by performing IDFT by mapping the first mapped sequence to the upper part of single IDFT and mapping the second mapped sequence to the lower part of the single IDFT.

The step of generating the transmission signal by performing IDFT may include, if the transmission signal is transmitted in two non-contiguous frequency bands, generating the transmission signal by performing IDFT by mapping the first mapped sequence and the second mapped sequence to separate IDFT.

A bandwidth of the single frequency of band may be 160 MHz.

A bandwidth of each of the two non-contiguous frequency bands may be 80 MHz.

The data unit may be encoded using BCC (binary convolution code) encoding.

In another aspect, a wireless apparatus is provided. The Apparatus includes a processor and a transceiver operationally coupled to the processor to transmit and receive a transmission signal. The processor is configured for the steps of: generating a data unit including a MAC (Medium Access Control) header and MSDU (MAC Service Data Unit), generating an encoded data unit by encoding the data unit, generating one or more spatial blocks by dividing the encoded data unit, dividing each of the one or more spatial block into a first block and a second block, generating a first interleaved block and a second interleaved block by interleaving the first block and the second block respectively, generating a first mapped sequence by mapping the first interleaved block into signal constellation, generating a second mapped sequence by mapping the second interleaved block into signal constellation, generating the transmission signal by performing IDFT (Inverse Discrete Fourier Transform) to the first mapped sequence and the second mapped sequence and transmitting the transmission signal.

When transmitting a physical layer convergence procedure (PLCP) protocol data unit (PPDU), a data field constituting the PPDU is segmented so that the data field can be transmitted at a specific bandwidth. The segmented data field is respectively interleaved and thus can be transmitted through a wider bandwidth by using an interleaver supporting the existing bandwidth.

A data block in which the data field is segmented can be randomly allocated to a frequency band, and thus frequency diversity can be obtained. A frequency diversity gain can be more increased by performing segmentation randomly.

DETAILED DESCRIPTION OF THE EMBODIMENTS

Hereinafter, embodiments of the present invention will be described in detail with reference to the accompanying drawings.

A wireless local area network (WLAN) system according to an embodiment of the present invention includes at least one basic service set (BSS). The BSS is a set of stations (STAs) successfully synchronized to communicate with one another. The BSS can be classified into an independent BSS (IBSS) and an infrastructure BSS.

The BSS includes at least one STA and an access point (AP). The AP is a functional medium for providing a connection to STAs in the BSS through respective wireless media. The AP can also be referred to as other terminologies such as a centralized controller, a base station (BS), a scheduler, etc.

The STA is any functional medium including a medium access control (MAC) and wireless-medium physical layer (PHY) interface satisfying the institute of electrical and electronics engineers (IEEE) 802.11 standard. The STA may be an AP or a non-AP STA. Hereinafter, the STA refers to the non-AP STA unless specified otherwise.

The STA can be classified into a very high throughput (VHT)-STA, a high throughput (HT)-STA, and a legacy (L)-STA. The HT-STA is an STA supporting IEEE 802.11n. The L-STA is an STA supporting a previous version of IEEE 802.11n, for example, IEEE 802.11a/b/g. The L-STA is also referred to as a non-HT STA.

Figure 1:
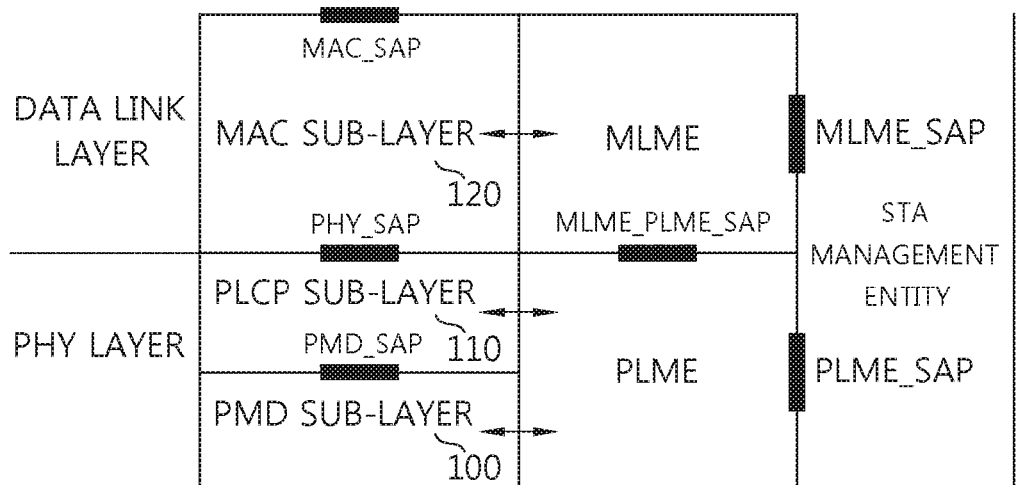
FIG. 1 shows a physical layer architecture of Institute of Electrical and Electronics Engineers (IEEE) 802.11.

FIG. 1 shows an IEEE 802.11 physical layer (PHY) architecture.

The IEEE 802.11 PHY architecture includes a PHY layer management entity (PLME), a physical layer convergence procedure (PLCP) sub-layer 110, and a physical medium dependent (PMD) sub-layer 100. The PLME provides a PHY management function in cooperation with a MAC layer management entity (MLME). The PLCP sub-layer 110 located between a MAC sub-layer 120 and the PMD sub-layer 100 delivers to the PMD sub-layer 100 a MAC protocol data unit (MPDU) received from the MAC sub-layer 120 under the instruction of the MAC layer, or delivers to the MAC sub-layer 120 a frame received from the PMD sub-layer 100. The PMD sub-layer 100 is a lower layer of the PDCP sub-layer and serves to enable transmission and reception of a PHY entity between two STAs through a radio medium. The MPDU delivered by the MAC sub-layer 120 is referred to as a physical service data unit (PSDU) in the PLCP sub-layer 110. Although the MPDU is similar to the PSDU, when an aggregated MPDU (A-MPDU) in which a plurality of MPDUs are aggregated is delivered, individual MPDUs and PSDUs may be different from each other.

The PLCP sub-layer 110 attaches an additional field including information required by a PHY transceiver to the MPDU in a process of receiving the MPDU from the MAC sub-layer 120 and delivering a PSDU to the PMD sub-layer 100. The additional field attached in this case may be a PLCP preamble, a PLCP header, tail bits required on a data field, etc. The PLCP preamble serves to allow a receiver to prepare a synchronization function and antenna diversity before the PSDU is transmitted. The PLCP header includes a field that contains information on a PLCP protocol data unit (PDU) to be transmitted, which will be described below in greater detail with reference to FIG. 2.

The PLCP sub-layer 110 generates a PLCP protocol data unit (PPDU) by attaching the aforementioned field to the PSDU and transmits the generated PPDU to a reception STA via the PMD sub-layer. The reception STA receives the PPDU, acquires information required for data recovery from the PLCP preamble and the PLCP header, and recovers the data.

Figure 2:
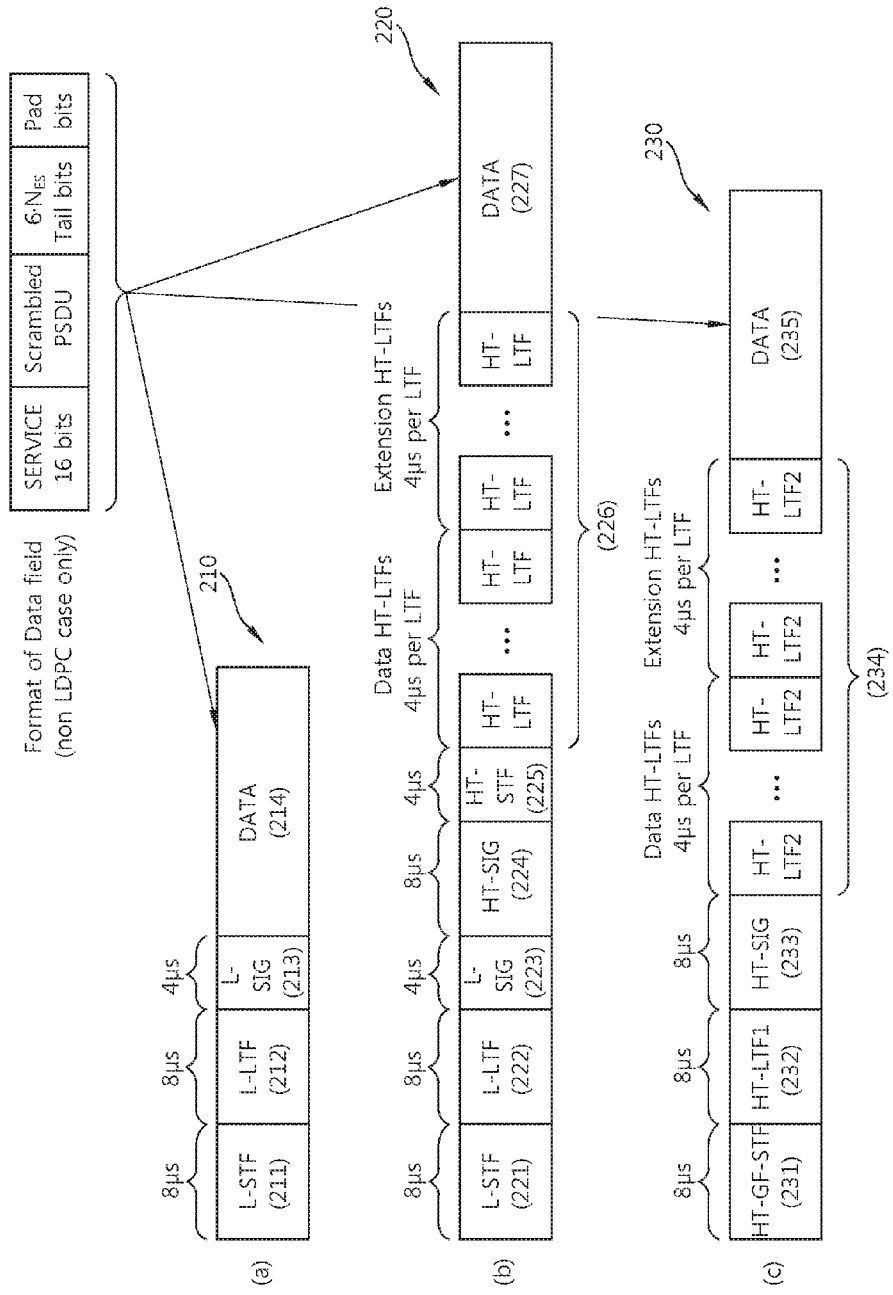
FIG. 2 is a diagram showing views (a), (b) and (c) of an example of a physical layer convergence procedure (PLCP) protocol data unit (PPDU) format used in a wireless local area network (WLAN) system based on the IEEE 802.11n standard.

FIG. 2 is a diagram showing an example of a PPDU format used in a WLAN system based on the IEEE 802.11n standard.

Referring to FIG. 2, there are three types of PPDUs supported in IEEE 802.11n.

FIG. 2(a) shows a legacy PPDU (L-PPDU) format for a PPDU used in the existing IEEE 802.11a/b/g. Therefore, an L-STA can transmit and receive an L-PPDU having this format in a WLAN system based on the IEEE 802.11n standard.

An L-PPDU 210 includes an L-STF field 211, an L-LTF field 212, an L-SIG field 213, and a data field 214.

The L-STF field 211 is used for frame timing acquisition, automatic gain control (AGC) convergence, coarse frequency acquisition, etc.

The L-LTF field 212 is used for frequency offset and channel estimation.

The L-SIG field 213 includes control information for demodulation and decoding of the data field 214.

The L-PPDU may be transmitted in the order of the L-STF field 211, the L-LTF field 212, the L-SIG field 213, and the data field 214.

FIG. 2(b) is a diagram showing an HT-mixed PPDU format in which an L-STA and an HT-STA can coexist. An HT-mixed PPDU 220 includes an L-STF field 221, an L-LTF field 222, an L-SIG field 223, an HT-SIG field 224, an HT-STF field 225, a plurality of HT-LTF fields 226, and a data field 227.

The L-STF field 221, the L-LTF field 222, and the L-SIG field 223 are identical to those shown in FIG. 2(a). Therefore, the L-STA can interpret the data field by using the L-STF field 221, the L-LTF field 222, and the L-SIG field 223 even if the HT-mixed PPDU 220 is received. The L-LTF field 222 may further include information for channel estimation to be performed by the HT-STA in order to receive the HT-mixed PPDU 220 and to interpret the L-SIG field 223, the HT-SIG field 224, and the HT-STF field 225.

The HT-STA can know that the HT-mixed PPDU 220 is a PPDU dedicated to the HT-STA by using the HT-SIG field 224 located next to the L-SIG field 223, and thus can demodulate and decode the data field 227.

The HT-STF field 225 may be used for frame timing synchronization, AGC convergence, etc., for the HT-STA.

The HT-LTF field 226 may be used for channel estimation for demodulation of the data field 227. Since the IEEE 802.11n supports single user-MIMO (SU-MIMO), a plurality of the HT-LTF fields 226 may be configured for channel estimation for each of data fields transmitted through a plurality of spatial streams.

The HT-LTF field 226 may consist of a data HT-LTF used for channel estimation for a spatial stream and an extension HT-LTF additionally used for full channel sounding. Therefore, the number of the plurality of HT-LTF fields 226 may be equal to or greater than the number of spatial streams to be transmitted.

The L-STF field 221, the L-LTF field 222, and the L-SIG field 223 are transmitted first so that the L-STA also can acquire data by receiving the HT-mixed PPDU 220. Thereafter, the HT-SIG field 224 is transmitted for demodulation and decoding of data transmitted for the HT-STA.

Up to fields located before the HT-SIG field 224, transmission is performed without beamforming so that the L-STA and the HT-STA can acquire data by receiving a corresponding PPDU. In the subsequently fields, i.e., the HT-STF field 225, the HT-LTF 226, and the data field 227, radio signal transmission is performed by using precoding. In this case, the HT-STF field 225 is transmitted so that an STA that receives a precoded signal can consider a varying part caused by the precoding, and thereafter the plurality of HT-LTF fields 226 and the data field 227 are transmitted.

Even if an HT-STA that uses 20 MHz in an HT WLAN system uses 52 data subcarriers per OFDM symbol, an L-STA that also uses 20 MHz uses 48 data subcarriers per OFDM symbol. Since the HT-SIG field 224 is decoded by using the L-LTF field 222 in a format of the HT-mixed PPDU 220 to support backward compatibility, the HT-SIG field 224 consists of 48×2 data subcarriers. The HT-STF field 225 and the HT-LTF 226 consist of 52 data subcarriers per OFDM symbol. As a result, the HT-SIG field 224 is supported using ½ binary phase shift keying (BPSK), each HT-SIG field 224 consists of 24 bits, and thus 48 bits are transmitted in total. That is, channel estimation for the L-SIG field 223 and the HT-SIG field 224 is performed using the L-LTF field 222, and a bit sequence constituting the L-LTF field 222 can be expressed by Equation 1 below. The L-LTF field 222 consists of 48 data subcarriers per one symbol, except for a DC subcarrier.

$$L_{-26,26} = \{1,1,-1,-1,1,1,-1,1,-1,1,1,1,1,1,1,-1,-1,1,\\ 1,-1,1,-1,1,1,1,1,0,1,-1,-1,1,1,-1,1,-1,1,-\\ 1,-1,-1,-1,1,1,-1,-1,1,-1,1,-1,1,1,1,1,1,\}$$ [Equation 1]

FIG. 2(c) is a diagram showing a format of an HT-Greenfield PPDU 230 that can be used by only an HT-STA. The HT-GF PPDU 230 includes an HT-GF-STF field 231, an HT-LTF1 field 232, an HT-SIG field 233, a plurality of HT-LTF2 fields 234, and a data field 235.

The HT-GF-STF field 231 is used for frame timing acquisition and AGC.

The HT-LTF1 field 232 is used for channel estimation.

The HT-SIG field 233 is used for demodulation and decoding of the data field 235.

The HT-LTF2 234 is used for channel estimation for demodulation of the data field 235. Since the HT-STA uses SU-MIMO, channel estimation is required for each of data fields transmitted through a plurality of spatial streams, and thus a plurality of HT-LTF2 fields 234 may be configured.

The plurality of HT-LTF2 fields 234 may consist of a plurality of data HT-LTFs and a plurality of extension HT-LTFs, similarly to the HT-LTF 226 of the HT-mixed PPDU 220.

Each of the data fields 214, 227, and 235 respectively shown in FIGS. 2(a), (b), and (c) may include a service field, a scrambled PSDU field, a tail bits field, and a padding bits field.

In the HT WLAN system, the HT-SIG field constituting the PPDU can be transmitted in such a manner that a bit sequence constituting the HT-SIG field is encoded, the encoded HT-SIG field is interleaved, a transmit (Tx) signal is generated by performing modulation and inverse discrete Fourier transform (IDFT) that maps a to-be-transmitted signal configured in a frequency domain to a time domain, a weight of cyclic shift diversity (CSD) is applied on an antenna basis, and then the Tx signal is transmitted through a radio frequency (RF) unit by inserting a guard interval (GI).

In addition, a process of transmitting the data field constituting the PPDU in the HT WLAN system includes scrambling the bit sequence constituting the data field, encoding the scrambled bit sequence, parsing the encoded bit sequence to a spatial stream and interleaving a data sequence allocated to each spatial stream, and generating a complex-valued sequence which is a mapped sequence by performing mapping to a signal constellation map. When binary convolution code (BCC) encoding is used as an encoding scheme in the HT WLAN system, the encoded bit stream is interleaved through a block interleaver. The interleaver uses a size of a column NCOL and a row NROW of an interleaver block according to a defined value. Table 1 below shows the defined value.

TABLE 1

| Parameter | 20 MHz | 40 MHz |
| --- | --- | --- |
| $N_{COL}$ | 13 | 18 |
| $N_{ROW}$ | $4 \times N_{BPSCS}(i_{SS})$ | $6 N_{BPSCS}(i_{SS})$ |
| $N_{ROT}$ | 11 | 29 |

Figure 3:
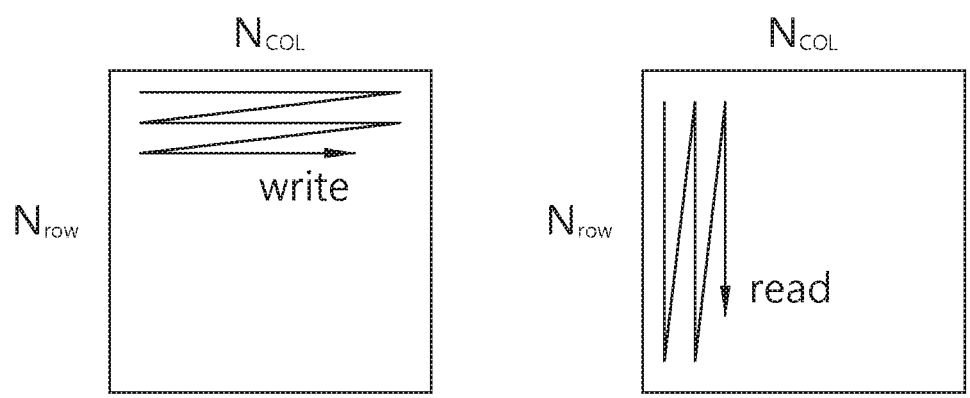
FIG. 3 shows an example of applying block interleaving to which an embodiment of the present invention can be applied.

In Table 1, NBPSCS(iSS) denotes the number of bits encoded per one carrier in each spatial stream (herein, iSS is an integer between 1 and NSS). A method of using such an interleaver includes inputting an encoded bit stream along a row and reading the input bit stream along a column. In this case, a method of using block interleaving shown in FIG. 3 can be used by reference.

Thereafter, a complex-valued sequence generated for each spatial stream is used to configure a signal for a space-time stream through space-time block coding. The signal can be subjected to spatial mapping for each antenna, and then can be transmitted through an RF unit after performing GI insertion. Herein, the spatial mapping may include a beamforming process for MIMO transmission.

Although it is described herein that the HT-SIG field is transmitted through one spatial stream, the data field can be transmitted through at least one or more spatial streams based on MIMO transmission.

As such, the HT-LTF is defined for channel estimation in order to use MIMO in the WLAN system supporting the HT. The HT-LTF is used for channel estimation similarly to an L-LTF, but has a difference in that the HT-LTF can estimate a MIMO channel. In order to estimate the MIMO channel by using the HT-LTF, an orthogonal mapping matrix PHTLTF is used by being multiplied by the HT-LTF. The PHTLTF consists of '1' and '−1' and can be expressed by Equation 2 below.

$$P_{HTLTF} = \begin{bmatrix} 1 & -1 & 1 & 1 \\ 1 & 1 & -1 & 1 \\ 1 & 1 & 1 & -1 \\ -1 & 1 & 1 & 1 \end{bmatrix} \quad \text{[Equation 2]}$$

Herein, the orthogonal mapping matrix is used in a different size according to a channel layer, which will be described with reference to FIG. 4.

Figure 4:
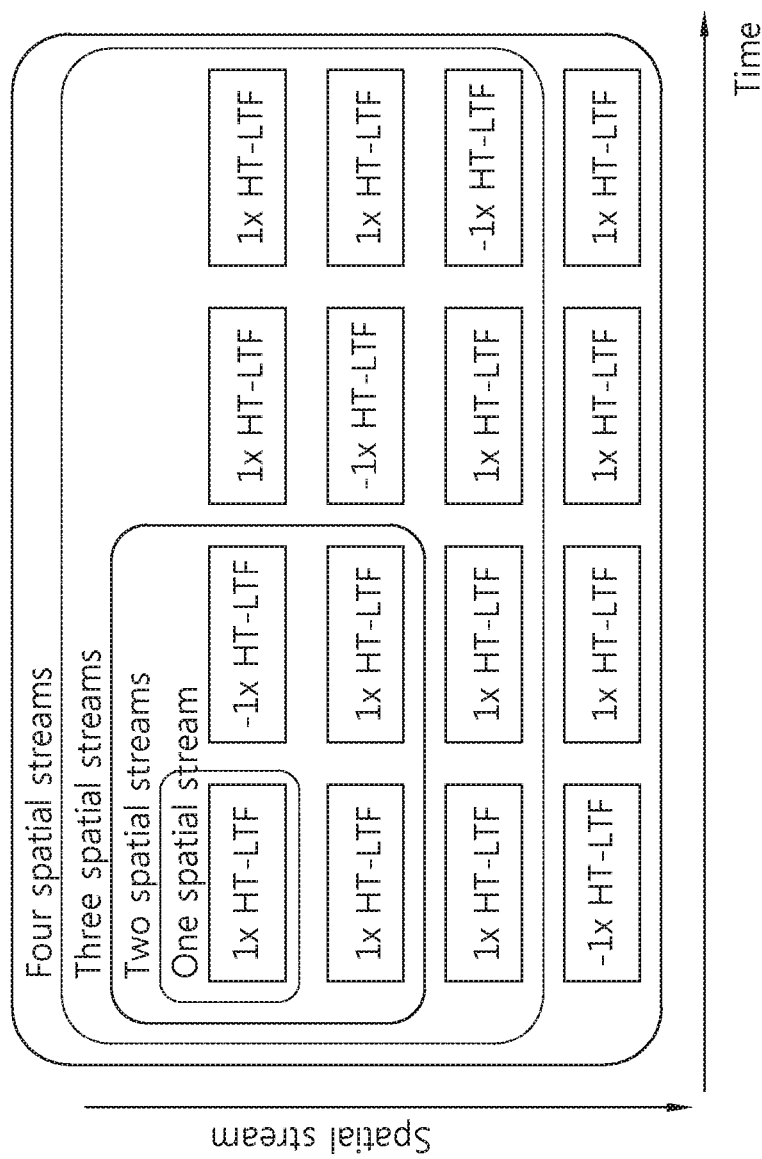
FIG. 4 shows an orthogonal mapping matrix based on a channel layer.

FIG. 4 shows an orthogonal mapping matrix based on a channel layer.

Referring to FIG. 4, a training symbol is defined on a spatial stream basis, and is transmitted for channel estimation of each spatial stream. When the number of spatial streams is 1, 2, and 4, the number of HT-LTFs to be transmitted is 1, 2, and 4, respectively. When the number of spatial streams is 3, one extra long training symbol is used so that 4 HT-LTFs can be used.

Figure 5:
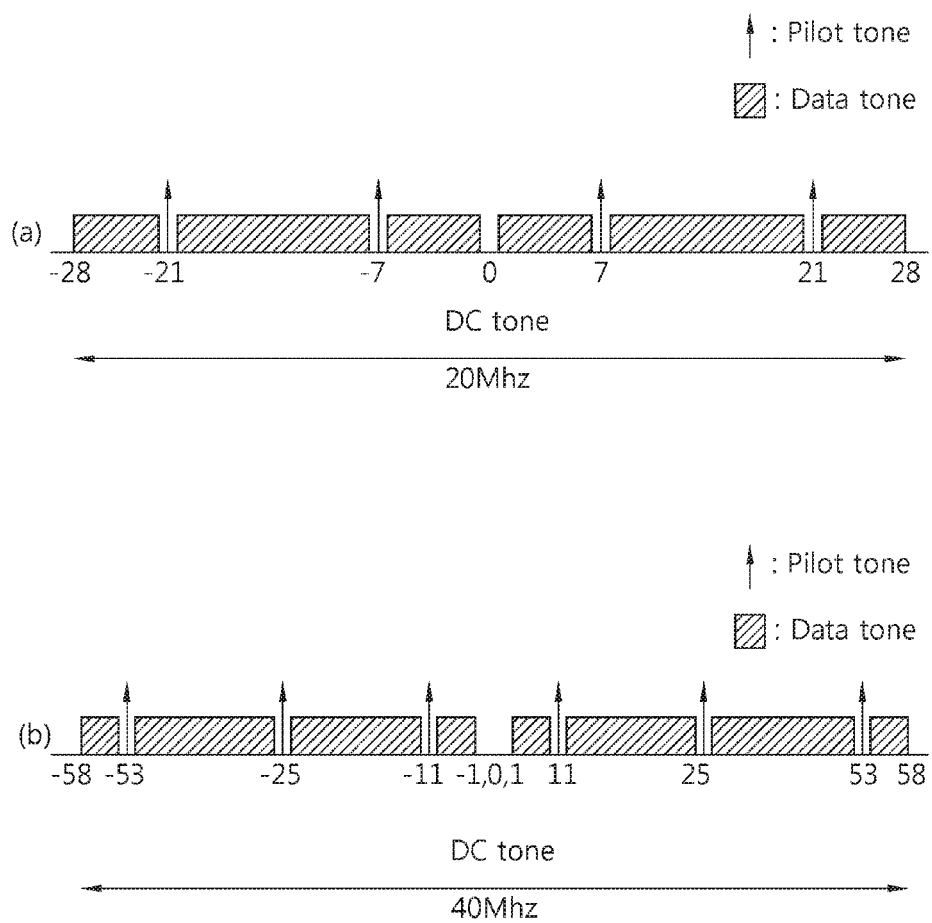
FIG. 5 shows views (a) and (b) of frequency tone allocation when supporting a bandwidth of 20 MHz and 40 MHz, where the bandwidth is 20 MHz in FIG. 5(a) and 40 MHz in FIG. 5(b).

FIG. 5 shows frequency tone allocation when supporting a bandwidth of 20 MHz and 40 MHz. The bandwidth is 20 MHz in FIG. 5(a) and 40 MHz in FIG. 5(b).

Referring to FIG. 5(a), when supporting 20 MHz bandwidth transmission, a tone #0 is used for a DC. A tone index [−21, −7, 7, 21] is used for a pilot, and the remaining tones are used for data transmission.

Referring to FIG. 5(b), when supporting 40 MHz bandwidth transmission, tones #−1, #0, and #1 are used for a DC. A tone index [−53, −25, −11, 11, 25, 53] is used for a pilot and is also used for measurement of a channel frequency offset. The remaining tones are used for data transmission.

Unlike the IEEE 802.11n standard supporting the HT, a next generation WLAN system requires a higher throughput. This is called a very high throughput (VHT) to distinguish it from the HT. For this, the next generation WLAN system intends to support 80 MHz bandwidth transmission, contiguous 160 MHz bandwidth transmission, non-contiguous 160 MHz bandwidth transmission and/or higher bandwidth transmission. In addition, a multi user-multiple input multiple output (MU-MIMO) transmission method is provided for a higher throughput. Hereinafter, this will be described in greater detail by reference to a PPDU format of a WLAN system supporting the VHT provided in the next generation WLAN system.

Figure 6:
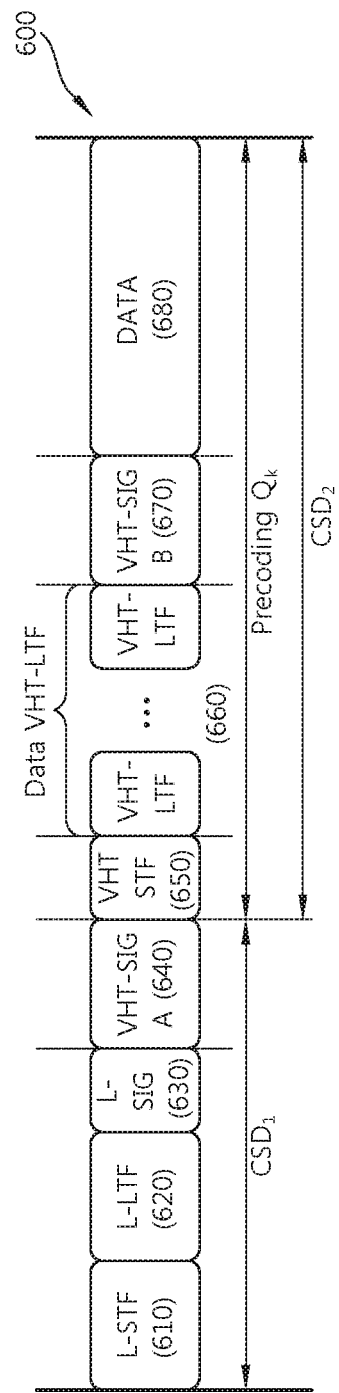
FIG. 6 shows an example of a PPDU format used in a next generation WLAN system.

FIG. 6 shows an example of a PPDU format used in a next generation WLAN system.

Referring to FIG. 6, a PPDU 600 includes an L-STF field 610, an L-LTF field 620, an L-SIG field 630, a VHT-SIGA field 640, a VHT-STF field 650, a VHT-LTF field 660, a VHT-SIGB field 670, and a data field 680.

In a PLCP sub-layer, a MAC protocol data unit (MPDU) including a MAC header and a MAC service data unit (MSDU) is used to generate the data field 680 by appending a service field, a tail field, and optionally, a padding bit to a PLCP service data unit (PSDU) delivered from a MAC layer. In addition, the PPDU 600 is generated by appending several fields such as the L-STF field 610, the L-LTF field 620, the L-SIG field 630, the VHT-SIGA field 640, the VHT-STF field 650, the VHT-LTF field 660, the VHT-SIGB field 670, or the like to the data field 680, and delivers the PPDU 600 to one or more STAs through a PMD layer.

The L-STF field 610 is used for frame timing acquisition, automatic gain control (AGC), coarse frequency acquisition, etc.

The L-LTF field 620 is used for channel estimation for demodulation of the L-SIG field 630 and the VHT-SIGA field 640.

The VHT-SIGA field 640 includes common information required when the PPDU is received by STAs using MU-MIMO transmission. That is, the VHT-SIGA field 640 includes information for interpreting the PPDU 600 used in the next generation WLAN. The VHT-SIGA field 640 includes information on a spatial stream for each STA, channel bandwidth information, STBC, a group identifier, information on an STA to which each group identifier is allocated, a short guard interval (GI), and beamforming information (including information indicating whether a MIMO transmission type is SU-MIMO or MU-MIMO).

The VHT-STF field 650 is used to improve performance of AGC estimation in MIMO transmission.

The VHT-LTF field 660 is used when the VHT-STA estimates a MIMO channel. Since the next generation WLAN system supports MU-MIMO, the VHT-LTF field 660 can be configured by the number of spatial streams in which the PPDU 600 is transmitted. In addition, when full channel sounding is supported and performed, the number of VHT-LTF fields 660 may increase.

The VHT-SIGB field 670 includes individual information for each STA. The VHT-SIGB field 670 includes each STA's coding type and MCS information. A size of the VHT-SIGB field 670 may differ according to the MIMO transmission type (MU-MIMO or SU-MIMO) and a channel bandwidth used for PPDU transmission.

The next generation WLAN system uses the aforementioned PPDU format and supports a bandwidth of 80 MHz, contiguous 160 MHz, and/or non-contiguous 160 MHz (80 MHz+80 MHz). For this, a new coding chain has to be defined. In particular, when 160 MHz transmission is performed by using a contiguous frequency band, it needs to be defined differently from a transmission procedure for a case where 160 MHz transmission is performed at a non-contiguous frequency band. A data transmission method for this will be proposed in the following description. Hereinafter, a data unit includes the concept of a bit sequence constituting the data field in the PPDU format that can be used in the next generation WLAN system.

Figure 7:
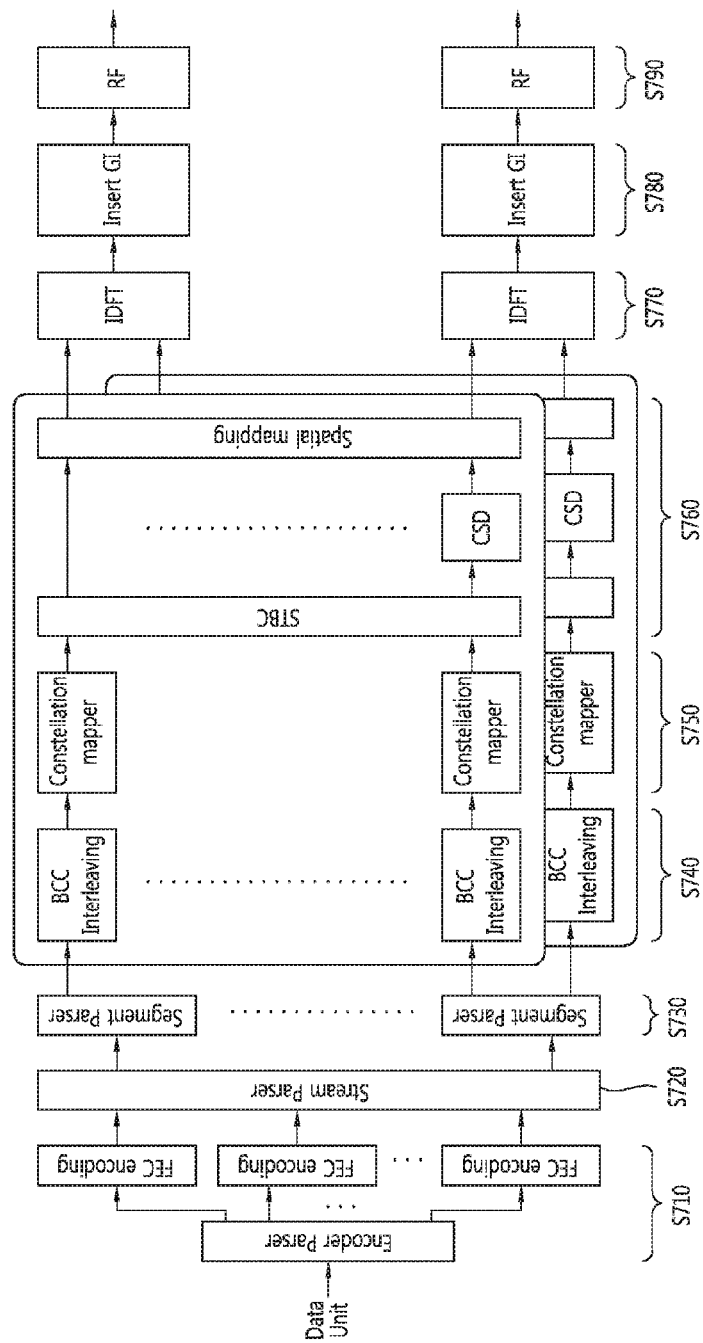
FIG. 7 is a block diagram showing a first example of a method of transmitting a data field according to an embodiment of the present invention.

FIG. 7 is a block diagram showing a first example of a method of transmitting a data field according to an embodiment of the present invention. The method of FIG. 7 can be used as an example of a data transmission method using a contiguous 160 MHz bandwidth in a next generation WLAN system, and also can be used as a data transmission method using a more general bandwidth.

Referring to FIG. 7, the data transmission method according to the embodiment of the present invention encodes a data unit (step S710). In this case, the data unit can be encoded by at least one or more encoders. When a plurality of encoders are used for encoding, an encoder parser can allocate a bit sequence having a specific bit size to each encoder, and each encoder can perform encoding. An encoding scheme used in this case may be a binary convolution code (BCC) encoding scheme. The data unit input to the encoder parser may be in a state where a bit sequence constituting a data field of a PPDU is scrambled.

The data unit encoded by at least one or more encoders is divided into a plurality of spatial streams by a stream parser (step S720). In this case, the encoded data unit divided to respective spatial streams is called a spatial block. The number of spatial blocks can be determined by the number of spatial streams used for PPDU transmission, and can be set to the number of spatial streams.

Each spatial block is divided into at least one or more data segments by a segment parser (step S730). As shown in the example of FIG. 7, the spatial block can be divided into two segments, i.e., a 1st data segment and a 2nd data segment. If the data unit is generated in accordance with 160 MHz transmission according to the embodiment of the present invention, the 1st and 2nd data segments divided by the segment parser are divided in accordance with 80 MHz transmission. Therefore, the 1st and 2nd data segments may be interleaved by an interleaver supporting 80 MHz data sequences.

The 1st and 2nd data segments are interleaved by respective interleavers (step S740). In this case, the interleavers can perform block interleaving, and more particularly, the interleavers may be BCC encoders for interleaving the 1st data segment and/or the 2nd data segment to which BCC encoding is applied. The interleaver uses a size of a column NCOL and a row NROW of an interleaver block according to a defined value. Table 2 below shows the defined value.

TABLE 2

| Parameter | 20 MHz | 40 MHz | 80 MHz |
|---|---|---|---|
| $N_{COL}$ | 13 | 18 | 26 |
| $N_{ROW}$ | $4 \times N_{BPSCS}$ | $6 \times N_{BPSCS}$ | $9 \times N_{BPSCS}$ |
| $N_{ROT}$ ($N_{SS} \le 4$) | 11 | 29 | 58 |
| $N_{ROT}$ ($N_{SS} > 4$) | 6 | 13 | 28 |

In Table 2, NBPSCS denotes the number of bits encoded per one carrier in each spatial stream. A method of using such an interleaver includes inputting an encoded bit stream along a row and reading the input bit stream along a column. The other way around is also possible. By reference, the aforementioned method of FIG. 3 can be used for the block interleaving.

Referring back to FIG. 7, 1st and 2nd interleaved data segments are mapped based on a constellation map by constellation mappers to generate 1st and 2nd mapped data segments (step S750). In this case, the 1st and 2nd mapped data segments may have a format of a complex-valued sequence. The 1st and 2nd interleaved data segments may use different constellation maps according to a modulation scheme such as BPSK, QPSK, 16-QAM, 64-QAM, or 256-QAM.

The 1st and 2nd mapped data segments constitute a signal for a space-time stream through space-time block coding, and are spatial-mapped for respective antennas (step S760).

The 1st and 2nd mapped data segments are converted by using IDFT (step S770), and are converted into Tx signals by performing GI insertion (step S780). The converted Tx signals are transmitted through respective radio frequency (RF) processes (step S790). In this case, if a bandwidth of a transport channel for PPDU transmission is a contiguous 160 MHz frequency band, the 1st and 2nd mapped data segments are converted by using one IDFT, and the 1st mapped data segment can be converted by being mapped to an upper part of IDFT and the 2nd mapped data segment can be converted by being mapped to a lower part of IDFT.

Although FIG. 7 shows an exemplary data transmission method when a PPDU is transmitted through a transport channel consisting of a contiguous frequency band, a different transmission method may be used when the PPDU is transmitted through a transport channel consisting of a non-contiguous frequency band. This will be described below with reference to FIG. 8.

Figure 8:
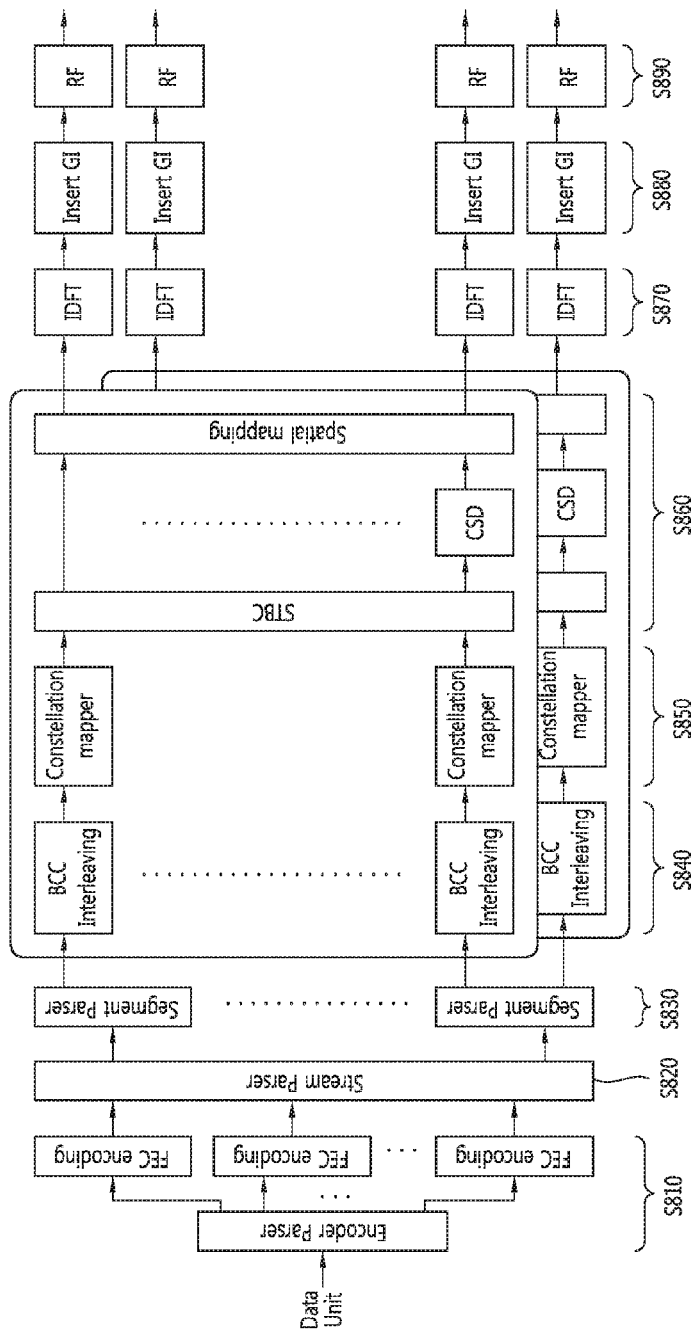
FIG. 8 is a block diagram showing a second example of a method of transmitting a data field according to an embodiment of the present invention.

FIG. 8 is a block diagram showing a second example of a method of transmitting a data field according to an embodiment of the present invention. The method of FIG. 8 can be used as an example of a data transmission method using a non-contiguous 160 MHz bandwidth, i.e., 80 MHz+80 MHz, in a next generation WLAN system, and also can be used as a data transmission method using a more general bandwidth having a non-contiguous property.

Referring to FIG. 8, the second example of the data transmission method of the present invention includes encoding a data unit (step S810), generating a spatial block by dividing the encoded data unit with respect to a spatial stream by a stream parser (step S820), dividing the spatial block into a 1st data segment and a 2nd data segment by a segment parser (step S830), interleaving each of the 1st and 2nd data segments (step S840), generating 1st and 2nd mapped data segments by mapping the 1st and 2nd interleaved data segments by using a constellation mapper (step S850), and performing spatial mapping on the 1st and 2nd mapped data segments (step S860). Since this is the same as steps S710 to S760 described above with reference to FIG. 7, detailed descriptions thereof will be omitted.

The 1st and 2nd mapped data segments are converted by using IDFT (step S870), and are converted into Tx signals by performing GI insertion (step S880). The converted Tx signals are transmitted through respective RF processes (step S890). In this case, if a bandwidth of a transport channel for PPDU transmission is a non-contiguous 160 MHz frequency band, i.e., an 80 MHz+80 MHz frequency band, the 1st and 2nd mapped data segments are converted by using different IDTFs, and the 1st mapped data segment can be converted by being mapped to an upper part of IDFT for the 80 MHz frequency band and the 2nd mapped data segment can be converted by being mapped to a lower part of IDFT.

Similarly to the data transmission method of FIG. 7 and FIG. 8, another method can be proposed in which a to-be-transmitted data unit is transmitted by being segmented according to a bandwidth of a transport channel. In this case, the data unit can be segmented in various manners. In addition, the segmented data piece may be transmitted by being mapped to a frequency band in various manners. This will be described below with reference to the accompanying drawings. Hereinafter, for convenience of explanation, a case of using an 80 MHz bandwidth will be exemplified in an embodiment of the present invention. However, the present embodiment is also applicable not only to the 80 MHz bandwidth but also to a case where data is transmitted at 20 MHz, 40 MHz, 80 MHz, contiguous 160 MHz, non-contiguous 160 MHz, or much wider bandwidth. For example, the following embodiment is also applicable to a case of performing transmission at contiguous 160 MHz or non-contiguous 80 MHz+80 MHz and to a case of using an interleaver supporting 80 MHz transmission.

Figure 9:
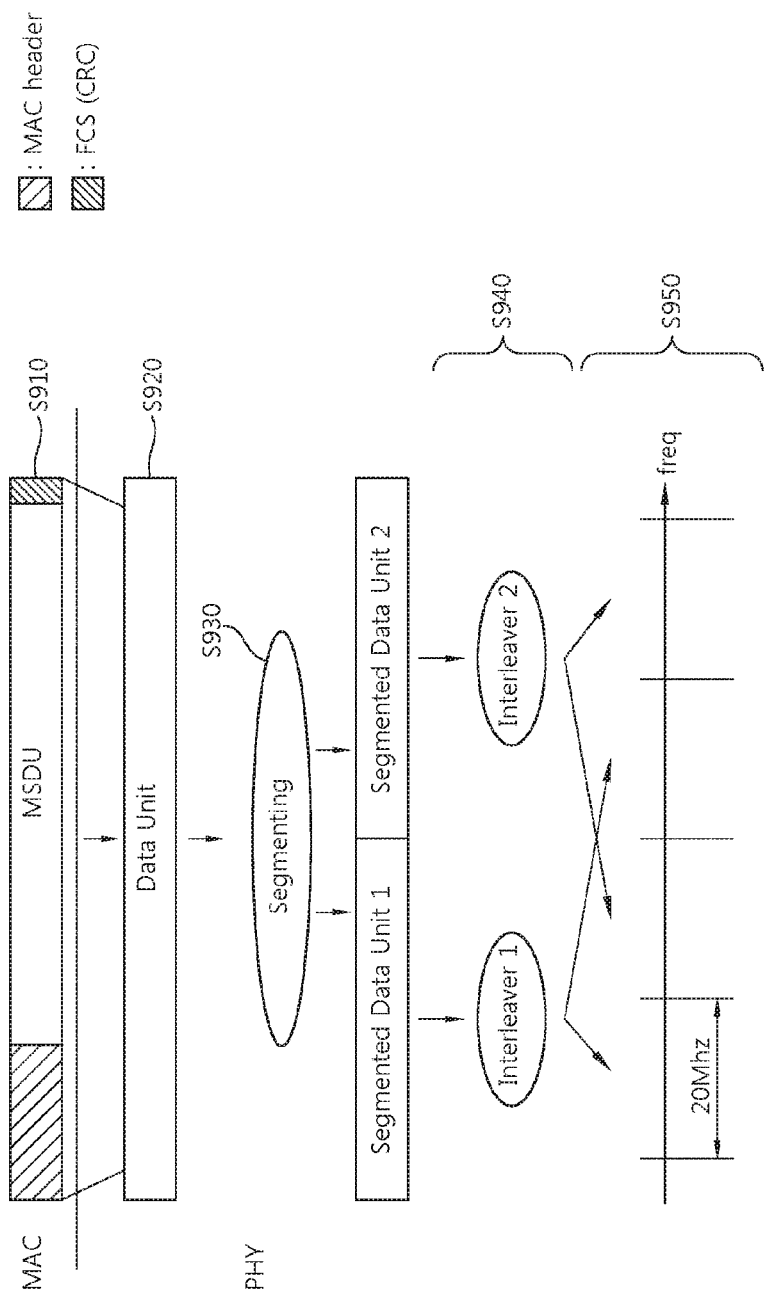
FIG. 9 shows a data transmission method according to an embodiment of the present invention.

FIG. 9 shows a data transmission method according to an embodiment of the present invention.

Referring to FIG. 9, a MAC layer generates an MPDU by appending a MAC header and an FCS to a MAC service data unit (MSDU) including data to be transmitted, and delivers the generated MPDU to a PHY layer (step S910). The MPDU can be called a PSDU in the PHY layer. The PHY layer generates a data unit by appending one or more fields including information required for data acquisition to the PSDU delivered from the MAC layer (step S920). Herein, the data unit may be the data field included in the PPDU transmitted by an AP and/or an STA.

The PHY layer segments the data unit (step S930). The segmentation process may be the same as the segment parsing process of FIG. 7 and FIG. 8. Since an interleaver supporting a 40 MHz bandwidth is used in the present embodiment, the data unit is segmented to a size capable of 40 MHz transmission. However, when using an interleaver supporting a 20 MHz bandwidth, an 80 MHz bandwidth, or a higher bandwidth or an interleaver supporting other bandwidths, the data unit can be segmented to fit a corresponding bandwidth size.

The segmented data units are interleaved by respective interleavers (step S940). The interleaving process may be the same as the interleaving process of FIG. 7 and FIG. 8.

The interleaved segmented data unit is mapped to a channel band (step S950). In the process of mapping the interleaved segmented data unit to a channel band, each of the interleaved segmented data units may be mapped to a frequency band in a distributed manner. That is, mapping can be performed such that one segmented data unit is halved so that two data units can be allocated to non-contiguous channel bands. By allocating the data units to the non-contiguous channel bands, frequency diversity can be obtained. After allocating the interleaved segmented data unit to the channel band, the data unit is transmitted by performing IDFT.

In the aforementioned method, an interleaver supporting a 40 MHz bandwidth can be used when transmission is performed by using an 80 MHz bandwidth, and there is no need to newly define an interleaver supporting a wider bandwidth, i.e., 80 MHz bandwidth. Although two interleavers supporting 40 MHz are defined in the present embodiment, one interleaver supporting 40 MHz can be used by the number of segmented data units.

Figure 10:
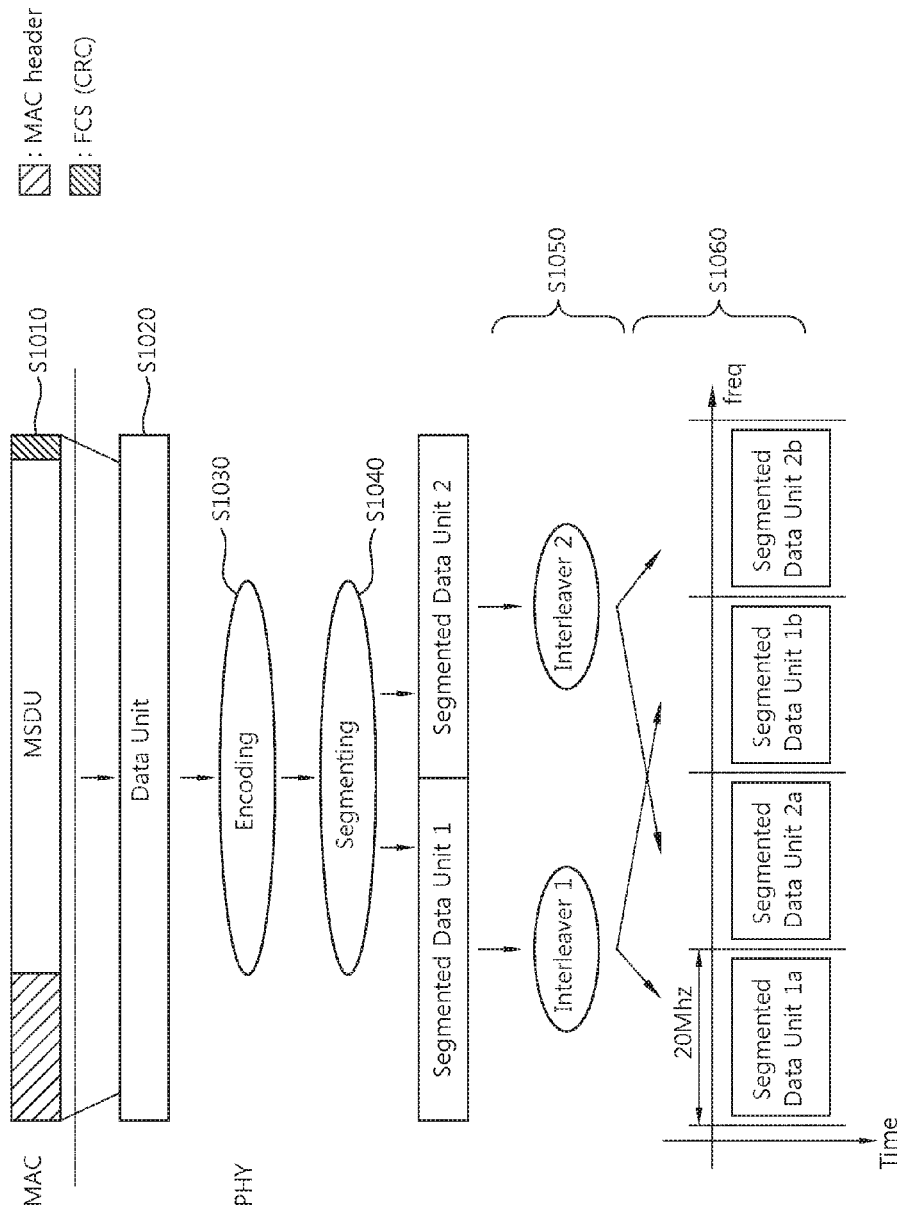
FIG. 10 shows a data transmission method according to another embodiment of the present invention.

FIG. 10 shows a data transmission method according to another embodiment of the present invention.

Referring to FIG. 10, a MAC layer generates an MPDU by appending a MAC header and an FCS to a MSDU including data to be transmitted, and delivers the generated MPDU to a PHY layer (step S1010). The MPDU can be called a PSDU in the PHY layer. The PHY layer generates a data unit by appending one or more fields including information required for data acquisition to the PSDU delivered from the MAC layer (step S1020). Herein, the data unit may be the data field included in the PPDU transmitted by an AP and/or an STA.

The PHY layer encodes a bit sequence constituting the received data unit before segmenting the data unit (step S1030).

The PHY layer segments the encoded data unit (step S1040). Since an interleaver supporting a 40 MHz bandwidth is used similarly to the segmentation process of FIG. 9, the encoded data unit may be segmented to a size capable of 40 MHz transmission. However, when using an interleaver supporting a 20 MHz bandwidth, an 80 MHz bandwidth, or a higher bandwidth or an interleaver supporting other bandwidths, the data unit can be segmented to fit a corresponding bandwidth size.

The segmented data units are interleaved by respective interleavers (step S1050). The interleaving process may be the same as the interleaving process of FIG. 7 and FIG. 8.

The interleaved segmented data unit is mapped to a channel band (step S1060). Herein, an interleaved segmented data unit 1 and an interleaved segmented data unit 2 can be allocated to a frequency band by being divided to a size of 20 MHz, and may be allocated to a channel band other than contiguous channel bands. That is, as illustrated, segmented data units 1a and 1b of the segmented data unit 1 and segmented data units 21 and 2b of the segmented data unit 2 may be mapped in a crossed manner. However, the segmented data units 1a, 1b, 2a, and 2b may be mapped to the frequency band by being divided according to any bandwidth size instead of being divided to the size of 20 MHz. Thereafter, the mapped segmented data units may be transmitted after performing IDFT.

Figure 11:
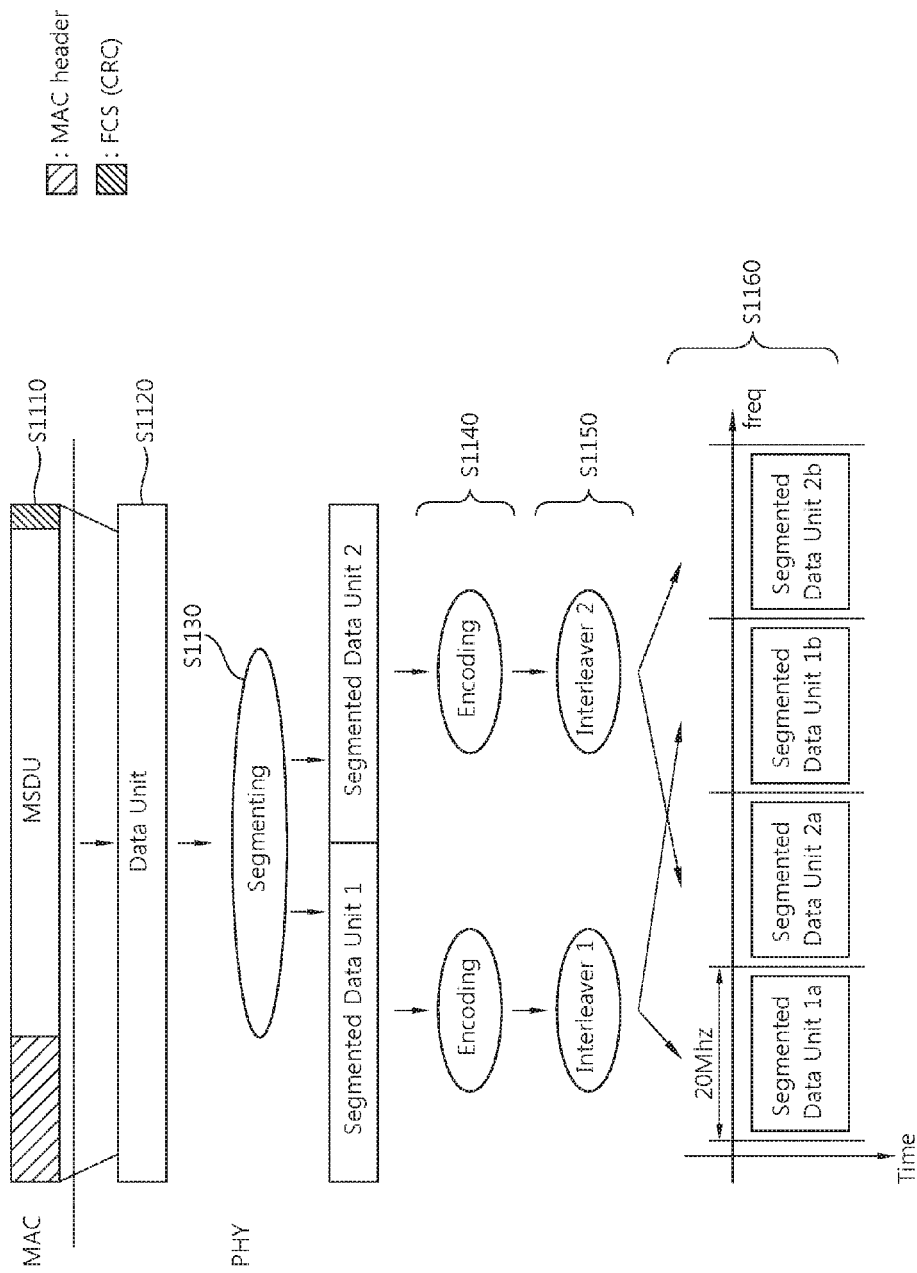
FIG. 11 shows a data transmission method according to another embodiment of the present invention.

FIG. 11 shows a data transmission method according to another embodiment of the present invention.

Referring to FIG. 11, a MAC layer generates an MPDU by appending a MAC header and an FCS to a MSDU including data to be transmitted, and delivers the generated MPDU to a PHY layer (step S1110). The MPDU can be called a PSDU in the PHY layer. The PHY layer generates a data unit by appending one or more fields including information required for data acquisition to the PSDU delivered from the MAC layer (step S1120). Herein, the data unit may be the data field included in the PPDU transmitted by an AP and/or an STA. The PPDU is generated by appending a PLCP header and a preamble including a training symbol (step S1120).

The PHY layer segments the data unit (step 1130). Since an interleaver supporting a 40 MHz bandwidth is used similarly to the segmentation process of FIG. 9, the encoded data unit may be segmented to a size capable of 40 MHz transmission. However, when using an interleaver supporting a 20 MHz bandwidth, an 80 MHz bandwidth, or a higher bandwidth or an interleaver supporting other bandwidths, the data unit can be segmented to fit a corresponding bandwidth size.

The PHY layer encodes a bit sequence constituting a segmented data unit 1 and a segmented data unit 2 which are generated by segmenting the data unit. In this case, encoding can be performed by individual encoders for the segmented data units (step S1140).

The encoded segmented data units are interleaved by respective interleavers (step S1150). The interleaving process may be the same as the interleaving process of FIG. 7 and FIG. 8.

The interleaved segmented data unit is mapped to a channel band (step S1160). Herein, an interleaved segmented data unit 1 and an interleaved segmented data unit 2 can be allocated to a frequency band by being divided to a size of 20 MHz, and may be allocated to a channel band other than contiguous channel bands. Since this is similar to the mapping process (step S1060) of FIG. 10, detailed descriptions thereof will be omitted. The segmented data units mapped to the channel band may be transmitted after performing IDFT.

Although it is shown in FIG. 10 and FIG. 11 that the segmented data unit is interleaved and is then mapped to the channel band, the present invention is not limited thereto. This will be described in greater detail with reference to FIG. 12.

Figure 12:
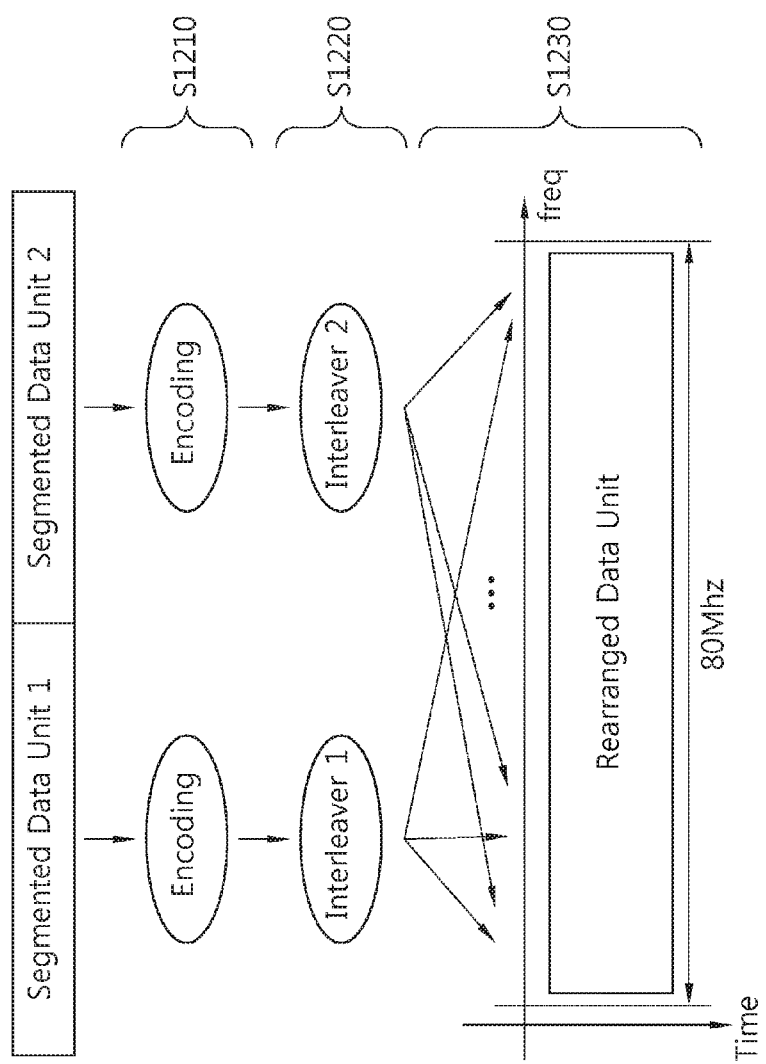
FIG. 12 shows a process of interleaving a segmented data unit and mapping the data unit to a channel band according to an embodiment of the present invention.

FIG. 12 shows a process of interleaving a segmented data unit and mapping the data unit to a channel band according to an embodiment of the present invention.

Referring to FIG. 12, segmented data units are encoded individually (step S1210). Although it is shown herein that the encoding process is performed after segmentation, the encoding process may be performed before the segmenting of the data unit The encoded segmented data units are interleaved by individual interleavers (step S1220). The interleaving process may be performed similarly to the interleaving process of FIG. 7 and FIG. 8. However, in order to rearrange an order of listing a bit sequence constituting encoded segmented data units 1 and 2, the interleaver may be configured to be able to implement another interleaving method.

The interleaved segmented data unit is mapped to a channel band (step S1230). Herein, instead of mapping the segmented data units 1 and 2 by re-dividing the data units according to a specific bandwidth size, mapping is performed in such a manner that output bits of the interleaver are allocated one by one to subcarriers.

In doing so, without having to newly define an interleaver supporting an 80 MHz bandwidth, the same effect as performing interleaving according to one 80 MHz bandwidth can be achieved by using the existing interleaver. In addition, a bit constituting the conventional data unit can be mapped to a channel band more randomly than a result of channel band mapping proposed in the aforementioned embodiment. The interleaving and channel mapping process proposed in FIG. 12 is applicable to the aforementioned data transmission method.

In the aforementioned various embodiments, a process of segmenting a data unit into a segmented data unit may be implemented by a method of rearranging an order of a bit sequence constituting the data unit and dividing it into a segmented data unit 1 and a segmented data unit 2. In this method, the data unit is interleaved more randomly, and thus Tx diversity can be increased.

Figure 13:
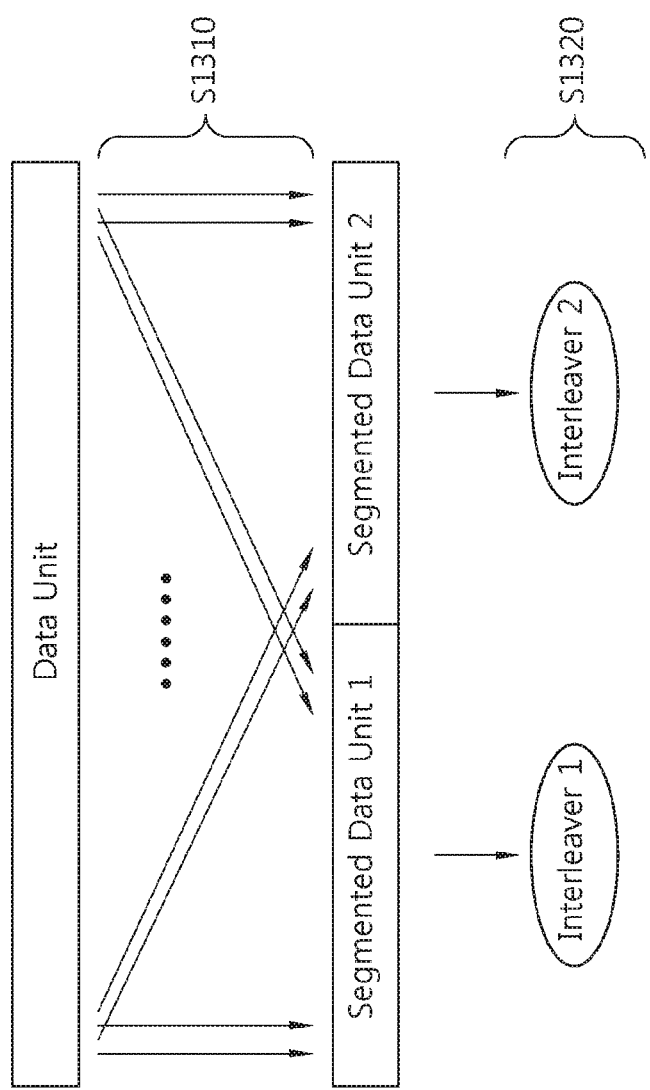
FIG. 13 shows a process of segmenting a data unit according to an embodiment of the present invention.

This will be described in detail with reference to FIG. 13. FIG. 13 shows a process of segmenting a data unit according to an embodiment of the present invention.

Referring to FIG. 13, the data unit is segmented to a size capable of 40 MHz transmission (step S1310). In this case, a bit sequence constituting the data unit is allocated to a segmented data unit 1 and a segmented data unit 2 in sequence. Herein, a unit of allocating the bit sequence to each segmented data unit may be a modulation order or a bit unit.

Each segmented data unit is delivered to an interleaver and is then interleaved (step S1320). The interleaving process can be performed similarly to the interleaving process of FIG. 7 and FIG. 8. Each of the interleaved segmented data units may be allocated to a channel band, and may be transmitted after IDFT.

When the bit sequence of the data unit is segmented by being allocated orderly, complexity is higher than a method of segmenting a full bit sequence by dividing the sequence in forward/backward order according to a bandwidth size. However, there is an advantage in that an interleaving result of the data unit can be obtained more randomly. In addition, a frequency diversity gain can be obtained more.

The data unit segmentation process of FIG. 13 can be applied to the segmentation process of the aforementioned embodiment described with reference to the drawings.

Figure 14:
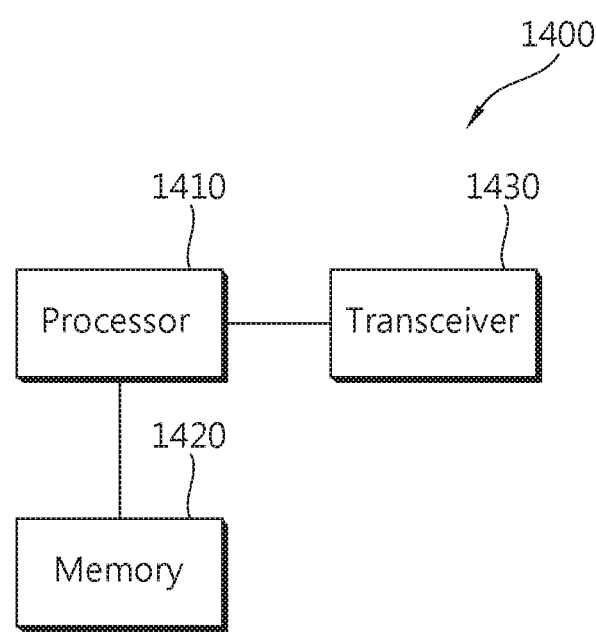
FIG. 14 is a block diagram showing a wireless apparatus according to an embodiment of the present invention.

FIG. 14 is a block diagram showing a wireless apparatus according to an embodiment of the present invention. A radio apparatus 1400 may be an AP or an STA.

Referring to FIG. 14, the wireless apparatus 1400 includes a processor 1410, a memory 1420, and a transceiver 1430. The transceiver 1430 transmits and/or receives a radio signal, and implements a PHY layer of IEEE 802.11. The processor 1410 is functionally coupled to the transceiver 1430, and implements a MAC layer of IEEE 802.11 and a PHY layer for performing a method of transmitting a PPDU delivered from the MAC layer. The processor 1410 is configured to implement the embodiment of the present invention shown in FIG. 6 to FIG. 13 related to a data transmission method in WLAN.

The processor 1410 and/or the transceiver 1430 may include an application-specific integrated circuit (ASIC), a separate chipset, a logic circuit, and/or a data processing unit. The memory 1420 may include a read-only memory (ROM), a random access memory (RAM), a flash memory, a memory card, a storage medium, and/or other equivalent storage devices. When the embodiment of the present invention is implemented in software, the aforementioned methods can be implemented with a module (i.e., process, function, etc.) for performing the aforementioned functions. The module may be stored in the memory 1420 and may be performed by the processor 1410. The memory 1420 may be located inside or outside the processor 1410, and may be coupled to the processor 1410 by using various well-known means.

The aforementioned embodiments include various exemplary aspects. Although all possible combinations for representing the various aspects cannot be described, it will be understood by those skilled in the art that other combinations are also possible. Therefore, all replacements, modifications and changes should fall within the spirit and scope of the claims of the present invention.

What is claimed is:

1. A method of transmitting data in a wireless local area network, the method comprising:
generating, by a transmitter, a data unit including a Medium access control Protocol Data Unit (MPDU);
generating, by the transmitter, an encoded data unit by performing a channel coding to the data unit;
generating, by the transmitter, at least one spatial block by re-arranging the encoded data unit;
dividing, by the transmitter, each spatial block of at least one spatial block into two frequency segments, wherein a bandwidth of each frequency segment is half of a bandwidth of the each spatial block;
interleaving, by the transmitter, the two frequency segments to generate a first interleaved segment and a second interleaved segment, respectively;
generating, by the transmitter, first and second mapped sequences by respectively mapping the first and second interleaved segments into a signal constellation;
performing, by the transmitter, an Inverse Discrete Fourier Transform (IDFT) on the first and second mapped sequences to generate a transmission signal;
inserting, by the transmitter, a guard interval (GI) into the transmission signal; and
transmitting, by the transmitter, the transmission signal via a Physical layer Protocol Data Unit (PPDU),
wherein the PPDU includes a first control signal field and a second control signal field,
wherein the first control signal field is followed by a short training field (STF) which is followed by the long training field which is followed by the second control signal field in the PPDU,
wherein the first control signal field is used to carry common control information and the second control signal field is used to carry station-specific information,
wherein the first control signal field includes a group ID for a receiving station and information on at least one spatial stream allocated to the receiving station, and
wherein the second control signal field includes information on modulation and coding scheme (MCS) used for the receiving station.

2. The method of claim 1, wherein the transmitter is a non-access point (non-AP) station.

3. The method of claim 1, wherein the transmitter is an access point (AP) station.

4. The method of claim 1, wherein the PPDU is used for single user (SU) transmission or multi user (MU) transmission.

5. The method of claim 1, wherein the dividing each spatial block comprises:
mapping bits of each spatial block of the at least one spatial block into the two frequency segments.

6. The method of claim 1, wherein a bandwidth of each of the two frequency segments is 80 MHz.

7. A device in a wireless local area network, the device comprising:
a transmitter; and
a controller operatively connected to the transmitter and configured to:
generate a data unit including a Medium access control Protocol Data Unit (MPDU);
generate an encoded data unit by performing a channel coding to the data unit;
generate at least one spatial block by re-arranging the encoded data unit;
divide each spatial block of at least one spatial block into two frequency segments, wherein a bandwidth of each frequency segment is half of a bandwidth of the each spatial block;
interleave the two frequency segments to generate a first interleaved segment and a second interleaved segment, respectively;
generate first and second mapped sequences by respectively mapping the first and second interleaved segments into a signal constellation;
perform an Inverse Discrete Fourier Transform (IDFT) on the first and second mapped sequences to generate a transmission signal;
insert a guard interval (GI) into the transmission signal; and
control the transmitter to transmit the transmission signal via a Physical layer Protocol Data Unit (PPDU),
wherein the PPDU includes a first control signal field and a second control signal field,
wherein the first control signal field is followed by a short training field (STF) which is followed by the long training field which is followed by the second control signal field in the PPDU,
wherein the first control signal field is used to carry common control information and the second control signal field is used to carry station-specific information,
wherein the first control signal field includes a group ID for a receiving station and information on at least one spatial stream allocated to the receiving station, and
wherein the second control signal field includes information on modulation and coding scheme (MCS) used for the receiving station.

8. The device of claim 7, wherein the device is a non-access point (non-AP) station.

9. The device of claim 7, wherein the device is an access point (AP) station.

10. The device of claim 7, wherein the PPDU is used for single user (SU) transmission or multi user (MU) transmission.

11. The device of claim 7, wherein the controller is further configured to:
map bits of each spatial block of the at least one spatial block into the two frequency segments.

12. The device of claim 7, wherein a bandwidth of each of the two frequency segments is 80 MHz.

* * * * *